United States Patent
Camarota et al.

(10) Patent No.: US 10,763,862 B1
(45) Date of Patent: Sep. 1, 2020

(54) BOUNDARY LOGIC INTERFACE

(71) Applicant: Xilinx, Inc., San Jose, CA (US)

(72) Inventors: Rafael C. Camarota, San Jose, CA (US); Ui S. Han, San Jose, CA (US); Weiguang Lu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/285,588

(22) Filed: Feb. 26, 2019

(51) Int. Cl.
*H03K 19/17736* (2020.01)
*G06F 30/33* (2020.01)

(52) U.S. Cl.
CPC ....... *H03K 19/17736* (2013.01); *G06F 30/33* (2020.01)

(58) Field of Classification Search
CPC .......................... H03K 19/17736; G06F 30/33
See application file for complete search history.

(56) References Cited

U.S. PATENT DOCUMENTS 7,015,719 B1 * 3/2006 Feng ................ H03K 19/17736
326/38
7,199,608 B1 * 4/2007 Trimberger ...... H03K 19/17732
326/38

FOREIGN PATENT DOCUMENTS

WO 2018034787 A1 2/2018

OTHER PUBLICATIONS

Xilinx, Inc., Wissolik, Mike, et al. "Virtex UltraScale+ HBM FPGA: A Revolutionary Increase in Memory Performance", WP485 (v1.0), Jun. 14, 2017, San Jose, CA USA.

* cited by examiner

*Primary Examiner* — Daniel D Chang
(74) *Attorney, Agent, or Firm* — Patterson + Sheridan, LLP

(57) ABSTRACT

Examples described herein provide for a boundary logic interface (BLI) to a programmable logic region in an integrated circuit (IC), and methods for operating such IC. An example IC includes a programmable logic region and boundary logic interfaces. The programmable logic region includes columns of interconnect elements disposed between columns of logic elements. The boundary logic interfaces are at respective ends of and communicatively connected to the columns of interconnect elements. The boundary logic interfaces are outside of a boundary of the programmable logic region. A first boundary logic interface (BLI) of the boundary logic interfaces is configured to be communicatively connected to an exterior circuit. The first BLI includes an interface configured to communicate a signal between the exterior circuit and the programmable logic region.

19 Claims, 12 Drawing Sheets

US 10,763,862 B1

BOUNDARY LOGIC INTERFACE

TECHNICAL FIELD

Examples of the present disclosure generally relate to an integrated circuit (IC) and methods of operating, and in particular, relate to a boundary logic interface (BLI) to a programmable logic region in an IC and methods for operating such IC.

BACKGROUND

A programmable logic device (PLD), such as a field programmable gate array (FPGA), is generally an integrated circuit (IC) that includes programmable logic. The programmable logic can be in a region of the IC, such as a programmable logic region. A programmable logic region of an IC may also be referred to as a fabric within the IC. The programmable logic region can be programmable to be configured to implement various logic functions, applications, or kernels. The logic functions, etc., can be performed on signals received by the programmable logic region from some circuit outside of the programmable logic region, and can generate signals to be transmitted from the programmable logic region to some circuit outside of the programmable logic region. In some instances, the architecture of the programmable logic region can create challenges for routing signals to and from the programmable logic region.

SUMMARY

Examples described herein provide an integrated circuit (IC) and methods of operating an IC. More particularly, some examples provide for a boundary logic interface (BLI) to a programmable logic region in an IC, and methods for operating such IC. A number of benefits and advantages of various examples may be achieved.

An example of the present disclosure is an IC. The IC includes a programmable logic region and boundary logic interfaces. The programmable logic region includes columns of interconnect elements disposed between columns of logic elements. The boundary logic interfaces are at respective ends of and communicatively connected to the columns of interconnect elements. The boundary logic interfaces are outside of a boundary of the programmable logic region. A first boundary logic interface (BLI) of the boundary logic interfaces is configured to be communicatively connected to an exterior circuit. The first BLI includes an interface configured to communicate a signal between the exterior circuit and the programmable logic region.

Another example of the present disclosure is a method for operating an IC. One or more first signals are routed between a first column of interconnect elements in a programmable logic region and a first boundary logic interface (BLI) outside of a boundary of the programmable logic region. One or more second signals are communicated between the first BLI and an exterior circuit.

A further example of the present disclosure is an IC. The IC includes a programmable logic region, a first boundary logic interface (BLI), and a second BLI. The programmable logic region is defined by a boundary. The programmable logic region includes a first column of programmable interconnect elements, a second column of programmable logic elements electrically connected to the first column, a third column of programmable interconnect elements, and a fourth column of programmable logic elements electrically connected to the third column. The first BLI is electrically connected to the first column and is outside of the boundary. The first BLI is configured to be electrically connected to a first exterior circuit. The second BLI is electrically connected to the third column and is outside of the boundary. The second BLI is configured to be electrically connected to a second exterior circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
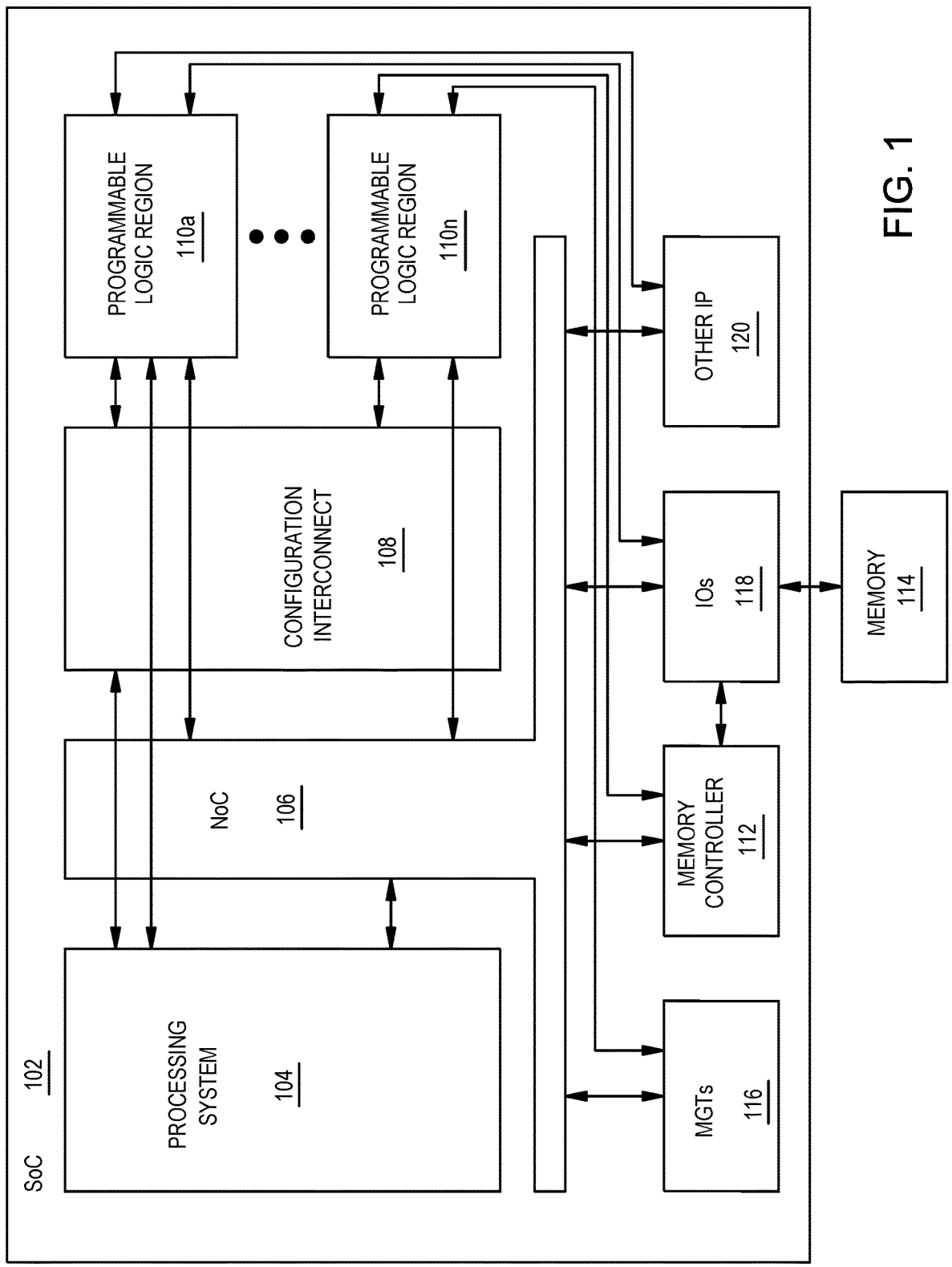
FIG. 1 is a block diagram depicting a system-on-chip (SoC) according to some examples.

Examples described herein provide an integrated circuit (IC) and methods of operating an IC. More particularly, some examples provide for a boundary logic interface (BLI) to a programmable logic region in an IC, and methods for operating such IC. In some examples, the BLI is outside of the programmable logic region. The BLI being outside of the programmable logic region can provide flexibility for the BLI and may not adversely affect resources within the programmable logic region. The BLI can have a flexible physical and/or logical width and height, which can permit increased uniformity for BLI cells, an improved horizontal-to-vertical escape line segment ratio, and inclusion of logic to flexibly communicate signals. In some examples, the BLI can have direct access to a global routing network of the programmable logic region and can directly communicate signals (e.g., data and/or clock signals) through the BLI without communicating those signals through a logic circuit that may increase a latency in the propagation of those signals (but may possibly communicate the signals through a level shifter to permit crossing power domains). In some examples, the BLI can include a synchronization stage that can form various levels of pipelining (e.g., form a first-in, first-out (FIFO) buffer) and/or that can include circuits configured to convert single data rate signals to double data rate signals (and vice versa). Other advantages and benefits may be achieved by various features and aspects described herein and as a person having ordinary skill in the art will readily recognize.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., vertical and horizontal, or a column and a row. These designations are for ease of description of generally perpendicular directions or orientations, and other directions or orientations may be implemented.

FIG. 1 is a block diagram depicting a system-on-chip (SoC) 102 according to some examples. The SoC 102 is an integrated circuit (IC) that is a programmable logic device, such as a field programmable gate array (FPGA). The SoC 102 comprises a processing system 104, a network-on-chip (NoC) 106, a configuration interconnect 108, one or more programmable logic regions 110a through 110n (generically, individually, or collectively, "programmable logic region(s) 110"), a memory controller 112, multi-gigabit transceivers (MGTs) 116, input/output blocks (IOs) 118, and other IP circuits 120.

In general, the processing system 104 is connected to the programmable logic region(s) 110 through the configuration interconnect 108. The processing system 104, programmable logic region(s) 110, memory controller 112, MGTs 116, IOs 118, and other IP circuits 120 are also connected to the NoC 106, and hence, may be communicatively coupled to each other via the NoC 106. The processing system 104, memory controller 112, MGTs 116, IOs 118, and other IP circuits 120 are also connected (e.g., directly) to respective subsets of the programmable logic region(s) 110. For example, each of the processing system 104, IOs 118, and other IP circuits 120 is connected to the programmable logic region 110a, and each of the memory controller 112 and MGTs 116 is connected to the programmable logic region 110n. In some examples, not all of the programmable logic region(s) 110 are connected to IOs 118 or MGTs 116. The circuits can be connected to any subset of the programmable logic region(s) 110, and the circuits may be connected in any combination with any other circuits to a given subset of the programmable logic region(s) 110. Additionally, the memory controller 112 is connected to at least one of the IOs 118, which is in turn connected to external memory 114, and hence, the memory controller 112 is communicatively coupled to the external memory 114. Accordingly, at least some of the IOs 118 may be communicatively coupled to the NoC 106 through the memory controller 112.

The processing system 104 can include one or more processor cores. For example, the processing system 104 can include a number of ARM-based embedded processor cores. The programmable logic region(s) 110 can include any number of configurable logic blocks, look-up tables (LUTs), digital signal processing blocks, random access memory blocks, UltraRAM blocks, and programmable interconnect elements, such as described below. The programmable logic region(s) 110 may be programmed or configured using the processing system 104 through the configuration interconnect 108. For example, the configuration interconnect 108 can enable, for example, frame-based programming of the fabric of the programmable logic region(s) 110 by a processor core of the processing system 104 (such as a platform management controller (PMC)).

The NoC 106 generally includes a routing network and a NoC peripheral interconnect (NPI). The routing network provides routing of NoC packets between different systems or circuits. The routing network includes NoC packet switches interconnected by line segments, which are between NoC master units (NMUs) and NoC slave units (NSUs). Each NMU is an ingress circuit that connects a master circuit to the NoC 106. Each NSU is an egress circuit that connects the NoC 106 to a slave endpoint circuit. Each NoC packet switch performs switching of NoC packets. Hence, the NMUs, NoC packet switches, and NSUs can be configured to provide a channel for communications between a master endpoint circuit to a slave endpoint circuit via an NMU, NoC packet switches interconnected by line segments, and an NSU. The NMUs, NoC packet switches, and NSUs also include register blocks, which are written to configure the respective NMU, NoC packet switch, and NSU. The register blocks can be written via the NPI. For example, a PMC can transmit memory mapped write requests to the NMUs, NoC packet switches, and NSUs via the NPI to write to the register blocks to configure the NMUs, NoC packet switches, and NSUs. The NPI can include interconnected NPI switches that can route the memory mapped write requests to the appropriate register block.

The external memory 114, as illustrated, is off-chip from the SoC 102, and in other examples, memory can be in the SoC 102. The external memory 114 can be any memory, such as static random access memory (SRAM), dynamic random access memory (DRAM) like double data rate synchronous DRAM (DDR SDRAM), or other memory. The IOs 118 can be any input/output circuit to communicatively couple the SoC 102 with other circuits and/or systems. In some examples, the IOs 118 can include high density input/output (HDIO) circuits, peripheral component interconnect express (PCIe) circuits, eXtreme Performance Input/Output (XPIO) circuits, and/or the like. The other IP circuits 120 can be, for example, digital clock managers, analog-to-digital converters, system monitoring logic, and/or any circuit for a given implementation. In some examples, at least some of the memory controller 112, MGTs 116, IOs 118, and/or other IP circuits 120 are configurable. For example, the memory controller 112, MGTs 116, IOs 118, and/or other IP circuits 120 can be configurable via the NPI of the NoC 106.

Figure 2:
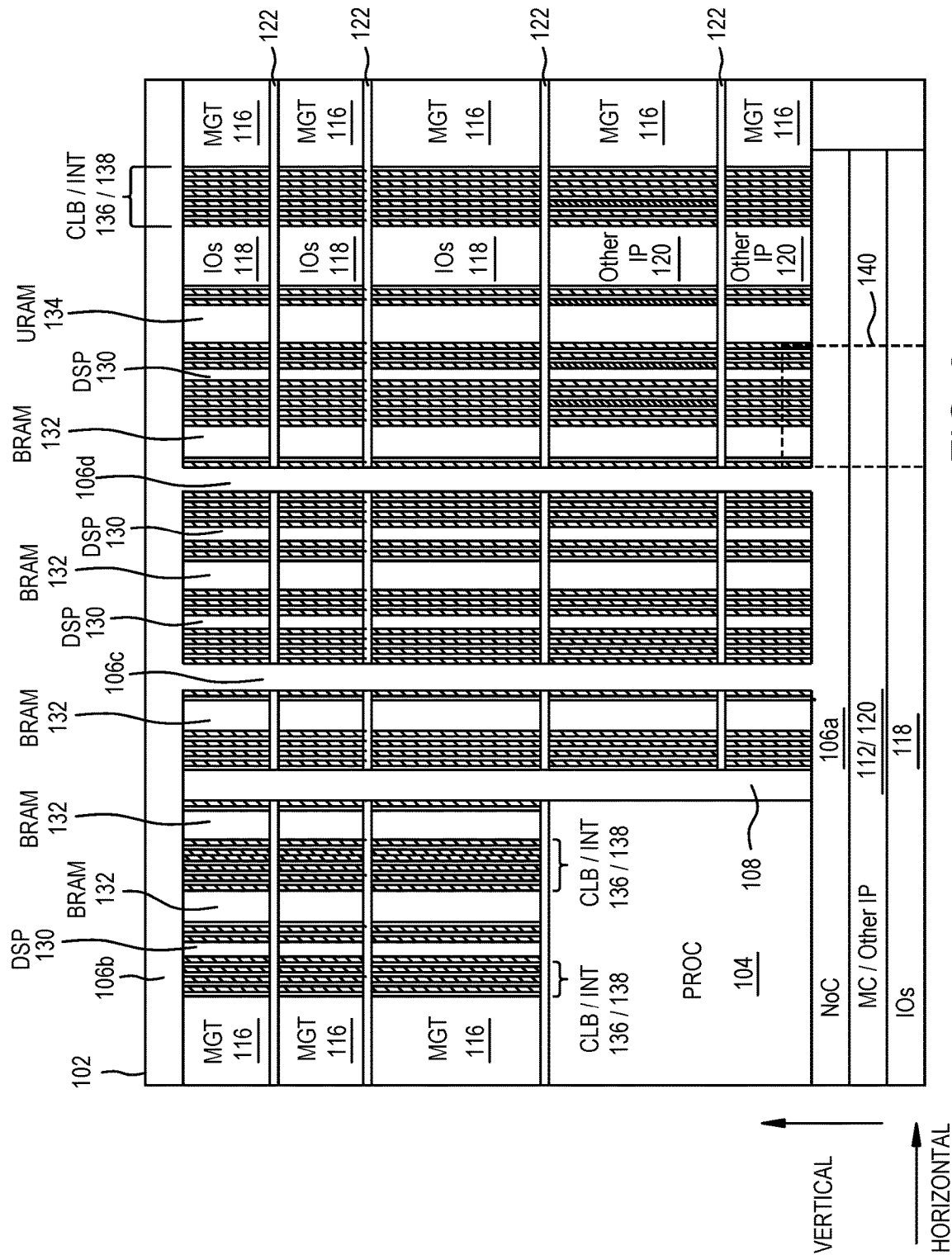
FIG. 2 is a layout of an FPGA that may be implemented as the SoC of FIG. 1 according to some examples.

FIG. 2 illustrates a layout of an FPGA that may be implemented as the SoC 102 of FIG. 1. Horizontal and vertical directions are illustrated for simplicity of reference. The FPGA includes programmable logic regions 110 (not specifically numbered) that include columns of various logic blocks. Any programmable logic region 110 can include any number and combination of columns of digital signal processing (DSP) blocks 130, random access memory blocks (BRAMs) 132, UltraRAM blocks (URAMs) 134, configurable logic blocks (CLBs) 136 (e.g. LUTs), and programmable interconnect elements (INTs) 138. A column of programmable interconnect elements 138 is generally disposed between neighboring columns of other logic blocks. The layout of FIG. 2 generally has five programmable logic regions 110, which will be described further below.

The NoC 106 has a lower horizontal NoC portion 106a, an upper horizontal NoC portion 106b, and two vertical NoC portions 106c, 106d. A memory controller 112 and some other IP circuits 120 are disposed in the area of the lower horizontal NoC portion 106a. IOs 118 are disposed along a bottom edge of the layout and between the lower horizontal NoC portion 106a and the bottom edge of the layout. The upper horizontal NoC portion 106b is along a top edge of the layout. The processing system 104 is along a first lateral edge of the layout and along the lower horizontal NoC portion 106a. MGTs 116 are along the first lateral edge of the layout extending from the processing system 104 to the upper horizontal NoC portion 106b. MGTs 116 are also along a second lateral edge (opposite from the first lateral edge) of the layout extending from the lower horizontal NoC portion 106a to the upper horizontal NoC portion 106b. The configuration interconnect 108 extends along a side of the processing system 104 and from the lower horizontal NoC portion 106a to the upper horizontal NoC portion 106b. A column of IOs 118 and other IP circuits 120 is proximate the MGTs 116 along the second lateral edge and extend from the lower horizontal NoC portion 106a to the upper horizontal NoC portion 106b. Rows 122 of clock and other control logic extend horizontally across the layout. The rows 122 are used to distribute the clock and other control signals across the breadth of the FPGA.

A first one of the programmable logic regions 110 is in the area between the processing system 104 and the upper horizontal NoC portion 106b and between the configuration interconnect 108 and the MGTs 116 along the first lateral edge of the layout. The programmable logic region 110 in this area includes one column of DSP blocks 130, two columns of BRAMs 132, some number of columns of CLBs 136, and some number of columns of programmable interconnect elements 138. A second one of the programmable logic regions 110 is in the area between the lower horizontal NoC portion 106a and the upper horizontal NoC portion 106b and between the configuration interconnect 108 and the vertical NoC portion 106c. The programmable logic region 110 in this area includes one column of BRAMs 132, some number of columns of CLBs 136, and some number of columns of programmable interconnect elements 138. A third one of the programmable logic regions 110 is in the area between the lower horizontal NoC portion 106a and the upper horizontal NoC portion 106b and between the vertical NoC portions 106c, 106d. The programmable logic region 110 in this area includes two columns of DSP blocks 130, one column of BRAMs 132, some number of columns of CLBs 136, and some number of columns of programmable interconnect elements 138. A fourth one of the programmable logic regions 110 is in the area between the lower horizontal NoC portion 106a and the upper horizontal NoC portion 106b and between the vertical NoC portion 106d and the column of IOs 118 and other IP circuits 120. The programmable logic region 110 in this area includes one column of DSP blocks 130, one column of BRAMs 132, one column of URAMs 134, some number of columns of CLBs 136, and some number of columns of programmable interconnect elements 138. A fifth one of the programmable logic regions 110 is in the area between the lower horizontal NoC portion 106a and the upper horizontal NoC portion 106b and between the column of IOs 118 and other IP circuits 120 and the MGTs 116 along the second lateral edge of the layout. The programmable logic region 110 in this area includes some number of columns of CLBs 136 and some number of columns of programmable interconnect elements 138.

A boundary area 140 is identified in the layout of FIG. 2. The boundary area 140 is at the end of columns of logic blocks in the programmable logic region 110. Aspects of this boundary area 140 will be described in more detail subsequently.

Other circuits and components can be included in the FPGA. For example, an array of data processing engines (DPEs) may be along the top edge of the layout at the upper horizontal NoC portion 106b.

Figure 3:
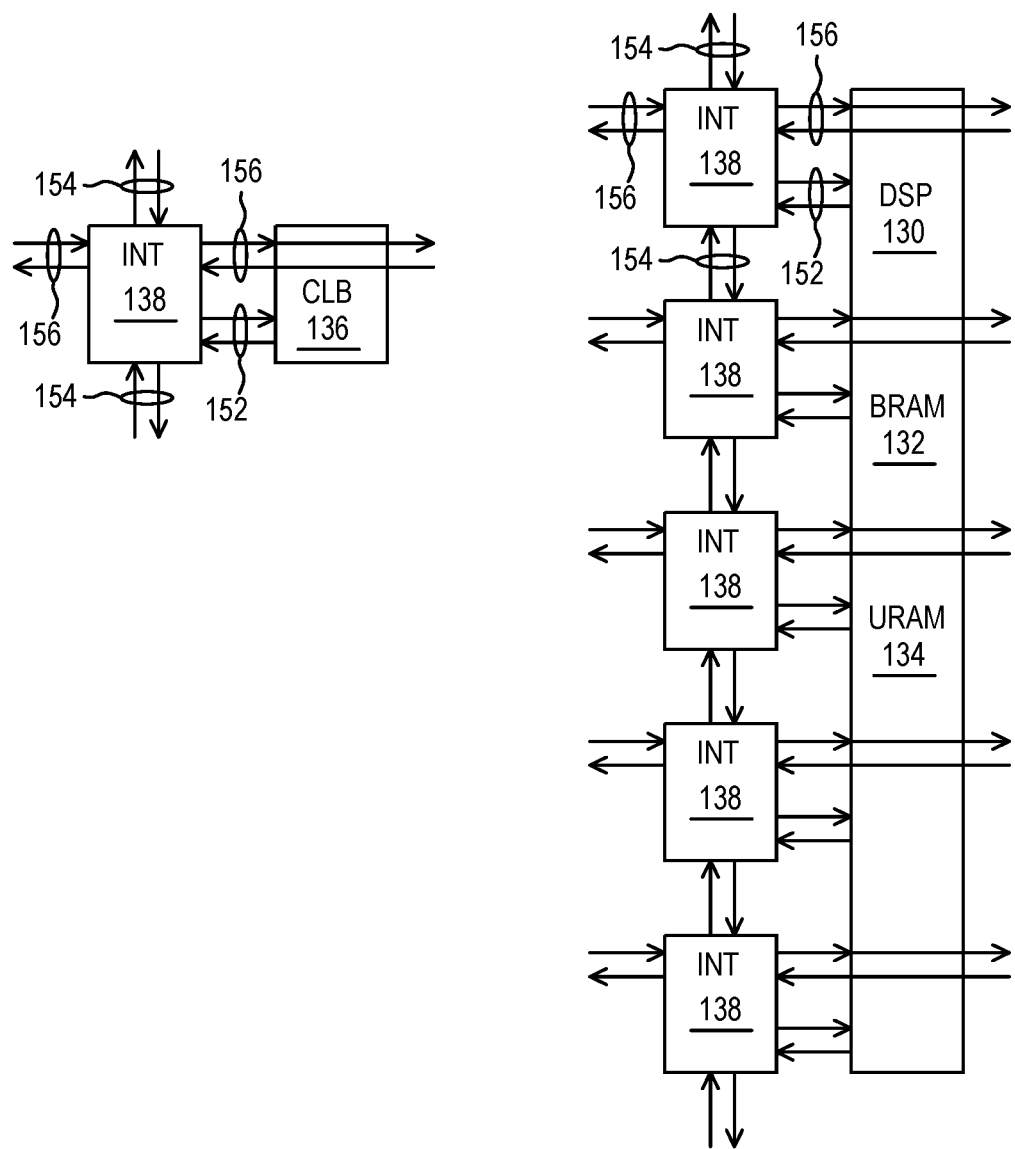
FIG. 3 is some blocks of columns in more detail according to some examples.

FIG. 3 illustrates some blocks of columns in more detail according to some examples. Each logic block in a column has connections by interconnect segments 152 to at least one programmable interconnect element 138 of a neighboring column. Each programmable interconnect element 138 includes connections by interconnect segments 154 to vertically adjacent programmable interconnect element(s) 138 in the same column. Each programmable interconnect element 138 also includes connections by interconnect segments 156 to programmable interconnect element(s) 138 in respective neighboring column(s) of programmable interconnect elements 138. The programmable interconnect elements 138 that are interconnected by vertical interconnect segments 154 and horizontal interconnect segments 156 form a global routing network in the programmable logic regions 110, which can be configured to route various clock signals and data signals within the programmable logic regions 110. Programmable interconnect elements 138 at a boundary of a programmable logic region 110 may be connected, e.g., by interconnect segments 154 to a boundary logic interface (BLI), as described below.

In an example implementation, a CLB 136 can include a configurable logic element that can be programmed to implement user logic and is connected by interconnect segment 152 to a single programmable interconnect element 138. As illustrated collectively for ease (e.g., would be implemented separately), a DSP block 130, BRAM 132, and URAM 134 can include a DSP logic element, a BRAM logic element, and a URAM logic element, respectively, and each can be connected by respective interconnect segments 152 to one or more programmable interconnect elements 138. Typically, the number of programmable interconnect elements 138 connected to a logic block by interconnect segments 152 depends on the height of the logic block. In the illustrated example, a DSP block 130, BRAM 132, and URAM 134 has the same height as five CLBs, but other numbers (e.g., four) can also be used.

Some FPGAs utilizing the architecture illustrated in FIG. 2 can include additional logic blocks that disrupt the regular columnar structure making up a large part of the FPGA. The additional logic blocks can be programmable blocks and/or dedicated logic. Note that FIG. 2 is intended to illustrate only an example FPGA architecture. For example, the numbers of logic blocks in a column, the relative width of the columns, the number and order of columns, the types of logic blocks included in the columns, the relative sizes of the logic blocks, and the interconnect/logic implementations included in FIG. 2 are purely an example.

Figure 4:
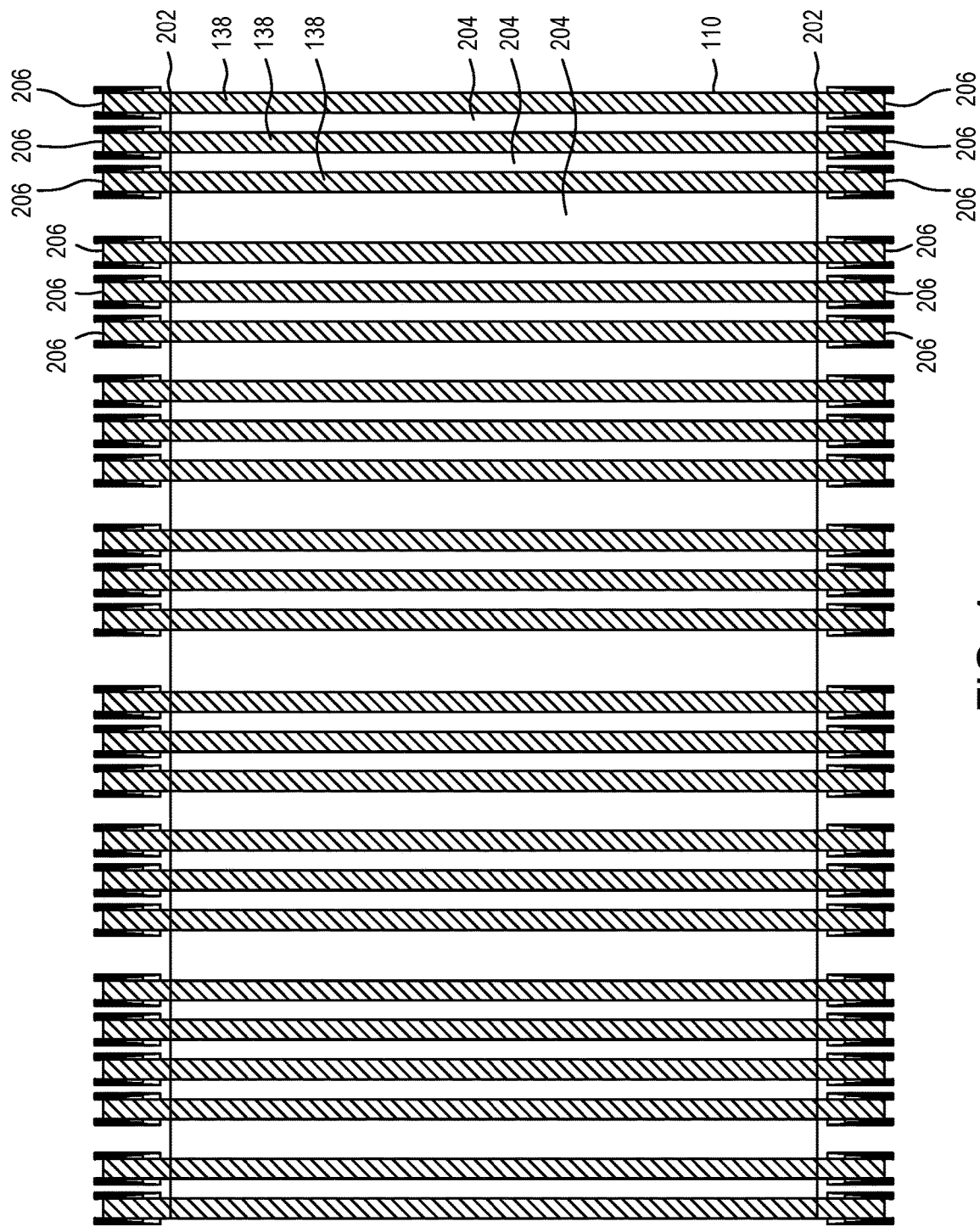
FIG. 4 is a general layout of a programmable logic region with an outer boundary according to some examples.

FIG. 4 illustrates a general layout of a programmable logic region 110 with an outer boundary 202 according to some examples. The layout shows the programmable logic region 110 including columns of fabric logic blocks 204 and columns of programmable interconnect elements 138. The fabric logic blocks 204 can be any of the DSP blocks 130, BRAMs 132, URAM 134, and CLBs 136. A column of programmable interconnect elements 138 is between each pair of neighboring columns of fabric logic blocks 204. A respective boundary logic interface (BLI) 206 is adjacent to and electrically connected to each column of programmable interconnect elements 138 at a top of the boundary 202 or at a bottom of the boundary 202.

The BLIs 206 are outside of the boundary 202 of the programmable logic region 110. The boundary of the programmable logic region 110 is at ends of the columns of logic blocks, for example. In some examples, the height of the programmable logic region 110, and hence the horizontal boundaries, can be defined as the area of logic blocks and programmable interconnect elements 138 configured by an integer multiple of a configuration frame that is implemented to configure the programmable logic regions 110 via the configuration interconnect 108. In some examples, the height of the programmable logic region 110 can be defined by where interconnect segments 154 loop back, although some examples contemplate that looping back can be implemented in a BLI outside of the programmable logic regions 110.

Figure 5:
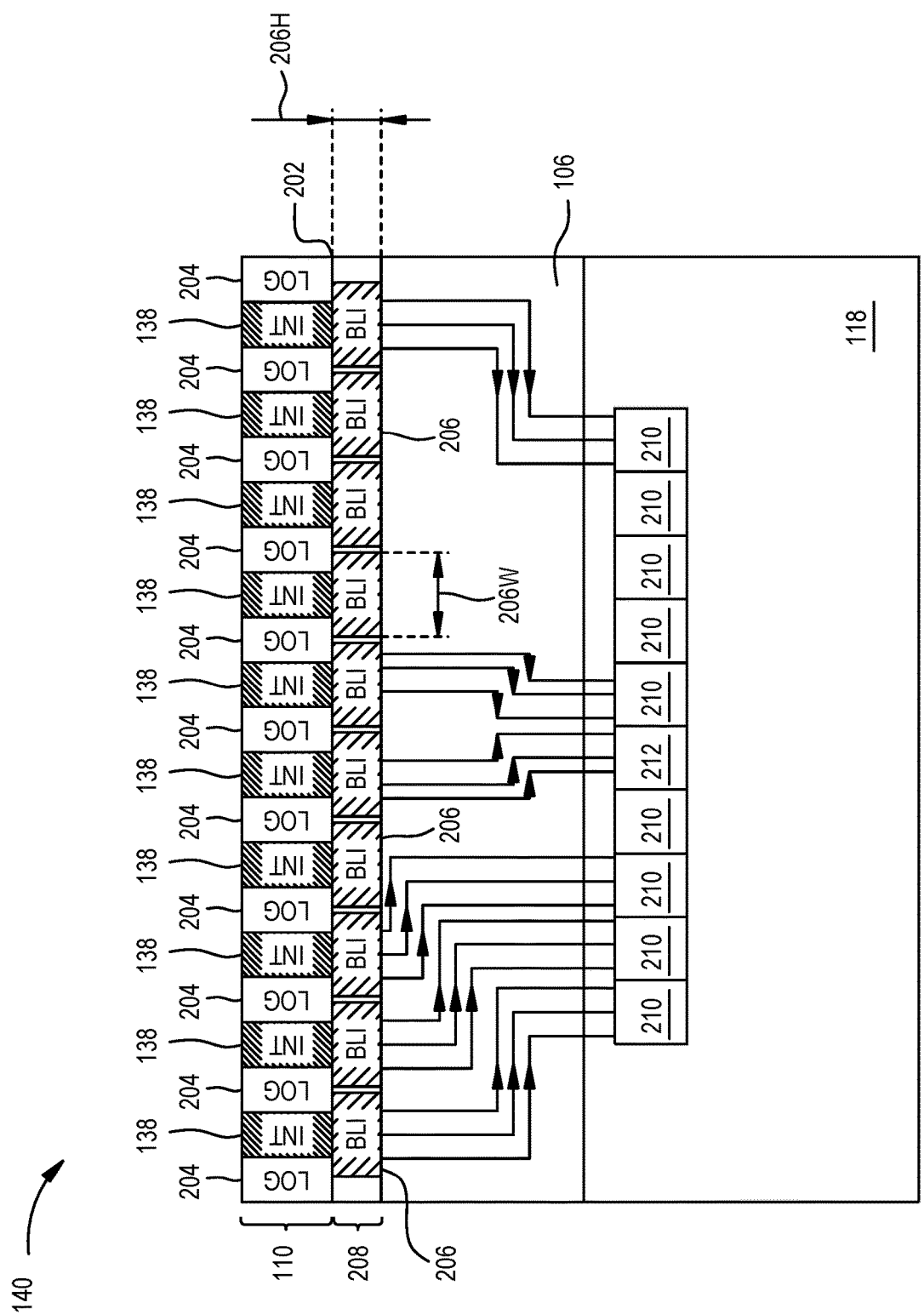
FIG. 5 is a layout of an example boundary area at a horizontal boundary of a programmable logic region according to some examples.

FIG. 5 illustrates a layout of an example boundary area 140 at a boundary 202 of a programmable logic region 110 according to some examples. Similar layouts can be repeated or replicated along the boundary 202 (e.g., at the bottom and at the top) of the programmable logic region 110.

Fabric logic blocks (LOGs) 204 and programmable interconnect elements (INTs) 138 are shown in the programmable logic region 110 and at the boundary 202. Fabric logic blocks 204 and programmable interconnect elements 138 in the programmable logic region 110 and at ends of respective columns are at and adjoin the boundary 202. BLIs 206 are disposed in a shim region 208 outside of the programmable logic region 110, e.g., on a side of the boundary 202 opposite from the fabric logic blocks 204 and the programmable interconnect elements 138. As will be described further below, each BLI 206 is connected, e.g., by interconnect segments 154, to a corresponding one of the programmable interconnect elements 138 across the boundary 202. In some examples, the shim region 208 is a dedicated area in the layout of the SoC 102 in which the BLIs 206 are disposed. In some examples, the shim region 208 overlaps or coincides with other regions, such as the NoC 106, memory controller 112, and/or other IP circuits 120. In further examples, the shim region 208 can be any combination of a dedicated region and overlapping or coinciding with other regions.

Each BLI 206 includes circuitry to interface the respective programmable interconnect element 138 with a circuit exterior to the programmable logic region 110. For example, the BLIs 206 can provide interfaces to the memory controller 112, the NoC 106, and/or other circuits. As illustrated, some BLIs 206 provide interfaces to physical interface blocks (PHY) 210 and/or phase-locked loop blocks (PLL) 212 in the IOs 118. The BLIs 206 are electrically connected, in the example, to the PHY 210 and PLL 212 via various line segments.

The BLIs 206 can include level shifters that are implemented to permit signals to be transmitted between a power domain implemented in the programmable logic region 110 and another power domain implemented outside of the programmable logic region 110. The BLIs 206 can include logic circuits to control which signals and how signals are input to the programmable interconnect elements 138 from the BLIs 206 and output from the BLIs 206 to circuits outside of the programmable logic region 110. The logic circuits can be configurable to selectively input and/or output signals. Any one or more of these aspects can be included in any BLI 206.

In some examples, when the BLIs 206 include configurable logic circuits, the BLIs 206 can be configured via the NPI. For example, each BLI 206 can include a register block that can be written to store configuration data of the respective BLI 206. A PMC on the processing system 104 can write to the register blocks of BLIs 206 using memory mapped write requests through the NPI of the NoC 106. Hence, the BLIs 206, in such examples, are configured through the NPI and not through the configuration interconnect 108.

According to some examples, implementing the BLIs 206 outside of the programmable logic regions 110 can provide flexibility in the design of the BLIs 206. Relative to implementing BLIs 206 within respective programmable logic regions 110, the area and/or dimensions of the BLIs 206 outside of the programmable logic regions 110 can be larger with little or no adverse impact to the programmable logic regions 110. As illustrated, the BLIs 206 can have a BLI height 206H (e.g., in a vertical direction parallel to the columns of the columnar logic structure). The BLI height 206H can vary between various implementations without causing the programmable logic region 110 to lose logic resources. For example, if the BLI 206 is in the programmable logic region 110, increasing the BLI height 206H can cause the programmable logic region 110 to lose logic resources because the larger BLI 206 may displace some logic resources. If the BLI 206 is outside of the programmable logic region 110, increasing the BLI height 206H generally would not cause the programmable logic region 110 to lose logic resources.

Further, as illustrated, the BLIs 206 can have a BLI width 206 W (e.g., in a horizontal direction perpendicular to the columns of the columnar logic structure). The BLI width 206 W can be larger than the width of the column of programmable interconnect elements 138 to which the respective BLI 206 is connected, such as illustrated. If the BLI 206 is in the programmable logic region 110, the width of the BLI 206 may be restricted by the width of the column of the programmable interconnect elements 138 in which the BLI 206 resides. This can result in different BLIs 206 having different layouts based on each type of logic to which the corresponding programmable interconnect elements 138 are connected. For example, in such situations, a column of programmable interconnect elements 138 connected to a column of CLBs 136 can be connected to BLIs that have a layout that differs from BLIs connected to programmable interconnect elements 138 that are connected to DSP blocks 130, etc. Outside of the programmable logic region 110, the BLI 206 may not be restricted to the width of the corresponding column of programmable interconnect elements 138 in the programmable logic region 110. With this restriction removed, more uniform BLI cells may be implemented as the BLIs 206 across the various programmable interconnect elements 138 that connect to different logic. For example, in some implementations, one BLI cell is used for each BLI 206 along bottom boundaries of the programmable logic regions 110, and another BLI cell is used for each BLI 206 along top boundaries of the programmable logic regions 110.

Due to the possible increased BLI width 206W when the BLI 206 is outside of the programmable logic regions 110, the BLI height 206H may be reduced relative to a BLI within the programmable logic region 110. As an example, a smallest BLI cell for a BLI in the programmable logic region 110 can have an area that is 76 μm (width) by 120 μm (height) compared to a BLI cell for a BLI 206 outside of the programmable logic regions 110 that can have an area that is 118 μm (width) by 77 μm (height). Other dimensions can be implemented, particularly with decreasing technology nodes.

Figure 6:
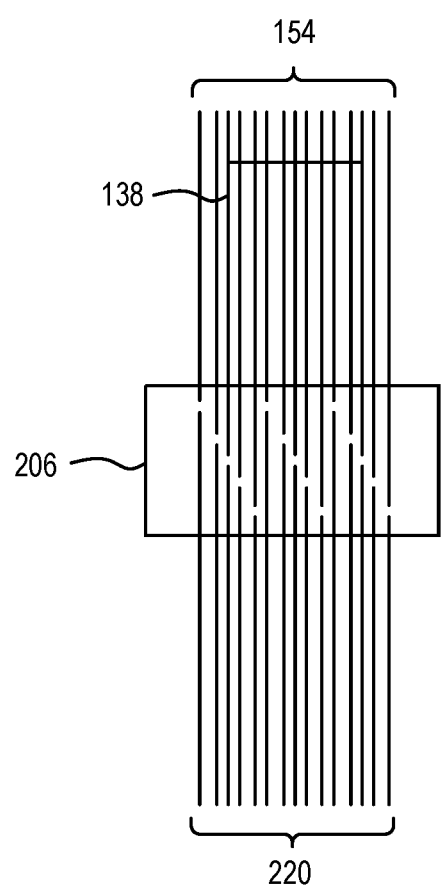
FIG. 6 shows line segments from an interconnect element that extend into a boundary logic interface (BLI) according to some examples.

An increased BLI width 206W can also permit a reduced horizontal line segment to vertical line segment ratio of line segments escaping or entering the BLI 206 compared to a BLI in the programmable logic region 110. FIG. 6 illustrates interconnect segments 154 from a programmable interconnect element 138 that extend into the BLI 206. Vertical line segments 220 escape or enter the BLI 206 to or from an exterior circuit. Since the BLI width 206W is greater than the width of the programmable interconnect element 138, more vertical line segments 220 can extend vertically from the BLI 206 than the number of interconnect segments 154 that extend vertically to the BLI 206 from the programmable interconnect element 138, although FIG. 6 illustrates an equal number. The number of interconnect segments 154 between the programmable interconnect element 138 and the BLI 206 may be restricted by the width of the programmable interconnect element 138, whereas the number of vertical line segments 220 is not restricted by the width of the programmable interconnect element 138. Various logic, such as described below, can permit a greater number of vertical line segments to extend between the BLI 206 and another circuit than to extend between the BLI 206 and the programmable interconnect element 138.

Having the flexibility to implement various sizes of the BLI cell can permit various logic, such as multiplexers (which can be nested or funneled), that can flexibly communicate signals. Any given signal could be directed on any of multiple line segments. This can permit flexibility in designs instantiated on the SoC 102. The signals can be transmitted from the BLI 206 to an exterior circuit or to the programmable interconnect element 138 on any one or more target line segments, which permits flexibility in how the signals are received and handled.

Flexibility in the size of the BLI cell of the BLI 206 can enable oversubscription. In some examples, a number of line segments from the programmable interconnect element 138 to the BLI 206 (e.g., for signals escaping or entering the programmable logic region 110) can be less than a number of line segments from the BLI 206 to a target exterior circuit. Hence, in some scenarios, a BLI 206 may receive more signals than it can directly communicate to the programmable interconnect element 138. Logic in the BLI 206 can permit different BLIs 206 to be electrically connected (e.g., adjacent BLIs 206 can be electrically connected). A BLI 206 can therefore be configured to communicate a signal to another (e.g., adjacent) BLI 206, and the receiving BLI 206 can then communicate that signal to the target external circuit. Having connections between BLIs 206 permits oversubscription.

Figure 7A:
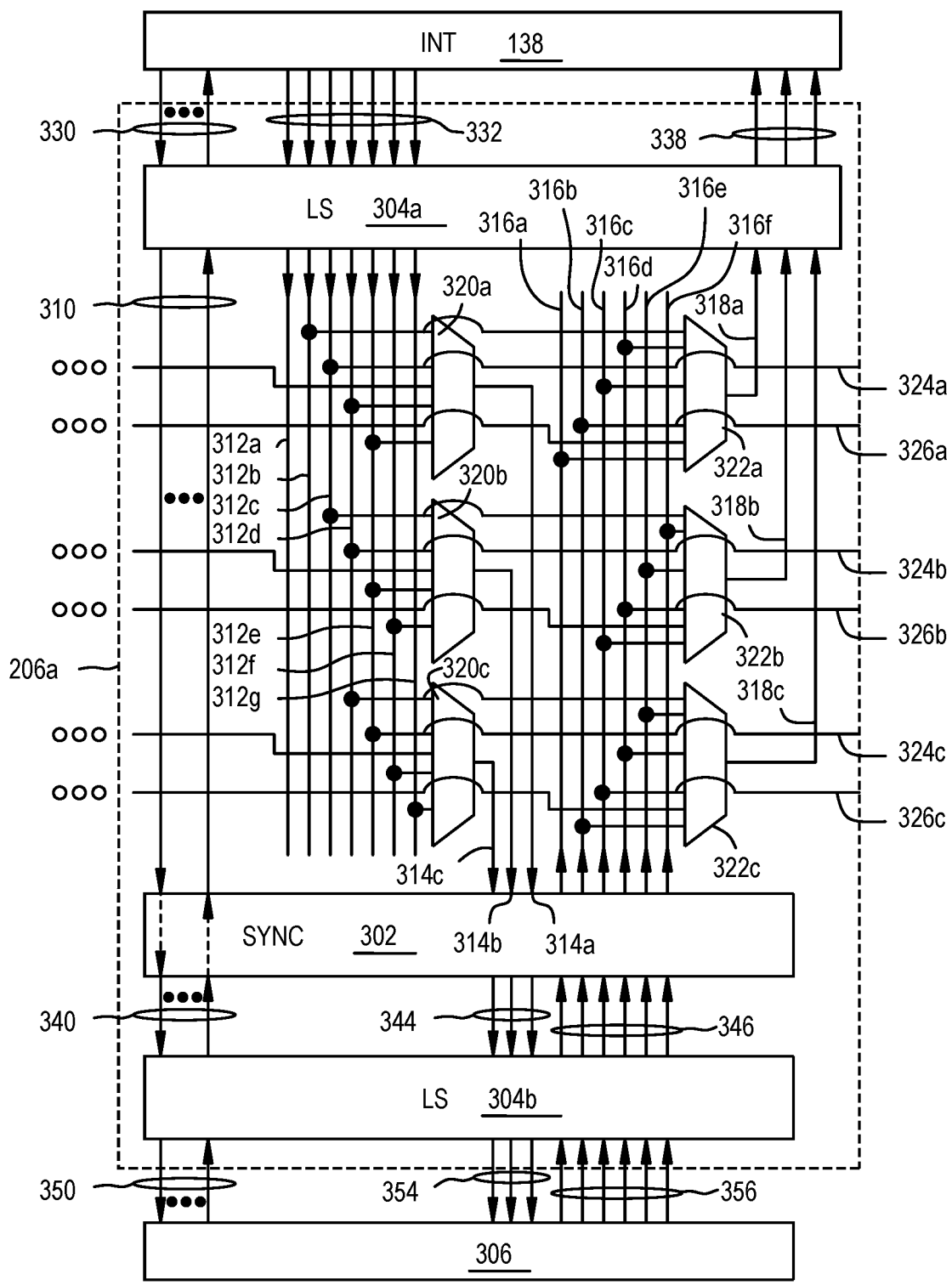
FIGS. 7A and 7B are logic that can be implemented in a BLI according to some examples.
Figure 7B:
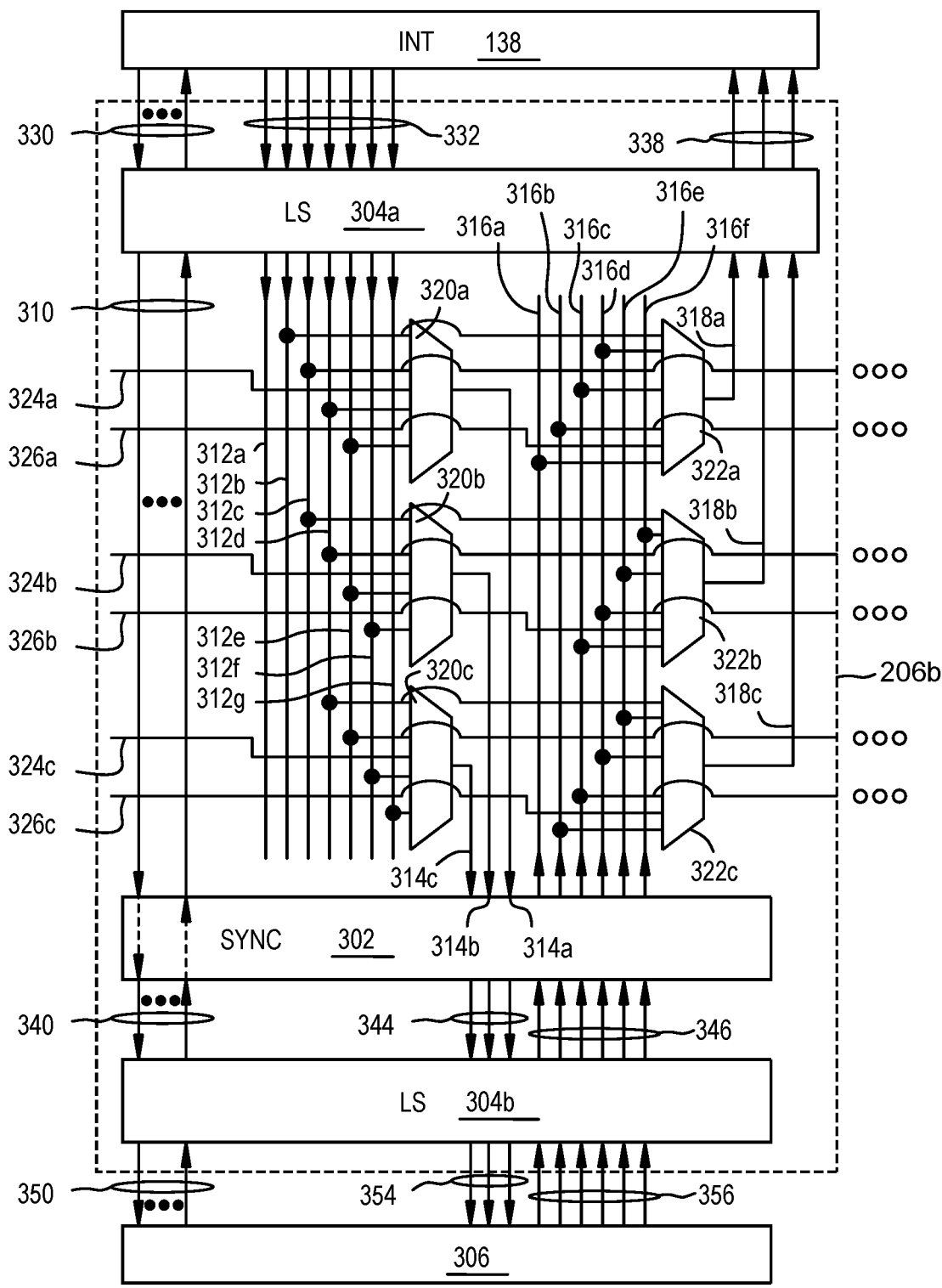

FIGS. 7A and 7B illustrate logic that can be implemented in a BLI 206 according to some examples. FIGS. 7A and 7B illustrate two adjacent BLIs 206*a*, 206*b* to illustrate various aspects that may be present in a BLI 206. Each BLI 206*a*, 206*b* includes various logic and line segments, a synchronization stage 302, and at least one level shifter 304*a*, 304*b*. As illustrated, each BLI 206*a*, 206*b* is electrically connected between a respective column of programmable interconnect elements 138 and a respective exterior circuit 306 (which may be configurable via the NPI of the NoC 106). The various logic and line segments illustrated in FIGS. 7A and 7B are illustrated as an example; other BLIs 206 can have different configurations of logic and/or line segments. The pattern illustrated by the BLIs 206*a*, 206*b*, and any modification thereto, can be replicated across multiple BLIs 206.

The BLI 206*a*, 206*b* includes line segments 310, input line segments 312*a*, 312*b*, 312*c*, 312*d*, 312*e*, 312*f*, 312*g* (collectively or individually, input line segment(s) 312), input line segments 314*a*, 314*b*, 314*c* (collectively or individually, input line segment(s) 314), output line segments 316*a*, 316*b*, 316*c*, 316*d*, 316*e*, 316*f* (collectively or individually, output line segment(s) 316), and output line segments 318*a*, 318*b*, 318*c* (collectively or individually, output line segment(s) 318). The BLI 206*a*, 206*b* further includes input multiplexers (IMUXs) 320*a*, 320*b*, 320*c* (collectively or individually, IMUX(s) 320) and output multiplexers (OMUXs) 322*a*, 322*b*, 322*c* (collectively or individually, OMUX(s) 322). Additionally, input cross line segments 324*a*, 324*b*, 324*c* (collectively or individually, input cross line segment(s) 324) and output cross line segments 326*a*, 326*b*, 326*c* (collectively or individually, output cross line segment(s) 326) traverse (e.g., horizontally) between neighboring BLIs 206*a*, 206*b*.

Line segments 310 can include line segments that carry signals escaping from the programmable logic region 110 (e.g., away from the programmable interconnect element 138 to the exterior circuit 306) and/or line segments that carry signals entering into the programmable logic region 110 (e.g., away from the exterior circuit 306 to the programmable interconnect element 138). The line segments 310 can carry clock signals and/or data signals. The line segments 310 do not communicate signals through, e.g., a multiplexer or logic circuit. The line segments 310 can permit faster propagation of signals because, e.g., the signals are not communicated through a logic circuit that can result in latency delays.

Connections to and from the IMUXs 320 and OMUXs 322 are described in the context of the BLI 206*b* to illustrate various connections of cross line segments 324, 326 to the neighboring BLI 206*a*. The BLI 206*a* includes similar connections to another neighboring BLI 206 (not shown). Further, the BLI 206*b* is connected to another BLI 206 (not shown) by similar connections. Various connections between BLIs 206*a*, 206*b* are illustrated to provide signals from the BLI 206*a* to the BLI 206*b*. In some examples, additional and/or different connections can be included between the BLIs 206*a*, 206*b*. For example, various connections between BLIs 206*a*, 206*b* can provide signals from the BLI 206*b* to the BLI 206*a*. In further examples, BLIs 206 that are not adjacent can be connected by similar connections.

The input line segments 312*b*, 312*c*, 312*d*, 312*e* of the BLI 206*b* and the input line segment 312*c* of the BLI 206*a* (via input cross line segment 324*a*) are connected to respective input nodes of IMUX 320*a* of the BLI 206*b*, which has an output node connected to the input line segment 314*a* of the BLI 206*b*. The input line segments 312*c*, 312*d*, 312*e*, 312*f* of the BLI 206*b* and the input line segment 312*d* of the BLI 206*a* (via input cross line segment 324*b*) are connected to respective input nodes of IMUX 320*b* of the BLI 206*b*, which has an output node connected to the input line segment 314b of the BLI 206b. The input line segments 312d, 312e, 312f, 312g of the BLI 206b and the input line segment 312e of the BLI 206a (via input cross line segment 324c) are connected to respective input nodes of IMUX 320c of the BLI 206b, which has an output node connected to the input line segment 314c of the BLI 206b.

The input line segment 312b of the BLI 206b, output line segments 316a, 316b, 316c, 316d of the BLI 206b, and output line segment 316b of the BLI 206a (via output cross line segment 326a) are connected to respective input nodes of OMUX 322a of the BLI 206b, which has an output node connected to the output line segment 318a of the BLI 206b. The input line segment 312c of the BLI 206b, output line segments 316c, 316d, 316e, 316f of the BLI 206b, and output line segment 316d of the BLI 206a (via output cross line segment 326b) are connected to respective input nodes of OMUX 322b of the BLI 206b, which has an output node connected to the output line segment 318b of the BLI 206b. The input line segment 312d of the BLI 206b, output line segments 316b, 316c, 316d, 316e of the BLI 206b, and output line segment 316c of the BLI 206a (via output cross line segment 326c) are connected to respective input nodes of OMUX 322c of the BLI 206b, which has an output node connected to the output line segment 318c of the BLI 206b.

The IMUXs 320 and OMUXs 322, and their respective connections, can provide flexibility in communicating signals from and to the programmable logic region 110. For example, the IMUXs 320 and OMUXs 322, and their respective connections, can permit oversubscription.

The synchronization stage 302 in the BLI 206a, 206b is connected to the line segments 310, 314, 316 and to line segments 340, 344, 346. The synchronization stage 302 can include logic that provides synchronization or pipelining (e.g., first-in, first-out (FIFO) buffering) of signals between the programmable logic region 110 and the respective exterior circuit 306 outside of the programmable logic region 110. The synchronization stage 302 can also include logic for increased data rates, such as for double data rate (DDR). Examples of the synchronization stage 302 are provided in subsequent figures.

The level shifter 304a is disposed in the BLI 206a, 206b between the respective programmable interconnect element 138 in the programmable logic region 110 and the logic of the BLI 206a, 206b (e.g., the IMUXs 320 and OMUXs 322). The level shifter 304b is disposed in the BLI 206a, 206b between the synchronization stage 302 and the respective exterior circuit 306 outside of the programmable logic region 110. In some examples, one level shifter 304a or 304b is implemented in each BLI 206 and can shift signals between different power or voltage levels when crossing between different power domains. For example, level shifter 304a can be implemented when logic of the BLI 206 (e.g., IMUXs 320 and OMUXs 322) are in a power domain of an exterior circuit 306, which power domain is different from the power domain of the programmable logic region 110. Further, level shifter 304b can be implemented when logic of the BLI 206 (e.g., IMUXs 320 and OMUXs 322) are in a power domain of the programmable logic region 110, which power domain is different from the power domain of the respective exterior circuit 306.

In some examples, clock and/or data signals on the respective line segments 310 are output from the programmable interconnect element 138 and are output to the exterior circuit 306 exterior to the programmable logic region 110 and BLI 206a, 206b. The signals may be level shifted by a level shifter 304a or 304b. Clock signals may further be input into the synchronization stage 302 (e.g., to provide synchronization for data sampling) and/or may pass through or bypass the synchronization stage 302. Line segments 330 extend from or to the respective programmable interconnect element 138 into or from the BLI 206a, 206b (e.g., to or from the level shifter 304a). The line segments 310 extend within the BLI 206a, 206b (e.g., from or to the level shifter 304a to or from the synchronization stage 302). Line segments 340 extend within the BLI 206a, 206b (e.g., from or to the synchronization stage 302 to or from the level shifter 304b). Line segments 340 extend from or to the BLI 206a, 206b (e.g., from or to the level shifter 304b) to or from the respective exterior circuit 306. In some examples, the various corresponding line segments may be the same line segments. For example, if level shifter 304a is omitted, the line segments 330, 310 may be the same line segments, and/or if level shifter 304b is omitted, the line segments 340, 350 may be the same line segments. Further, if the signals bypass the synchronization stage 302, the line segments 310, 340 may be the same line segments.

Data and/or clock signals on the respective input line segments 312 are output from the respective programmable interconnect element 138. Input line segments 332 extend from the respective programmable interconnect element 138 into the BLI 206a, 206b (e.g., to the level shifter 304a). The input line segments 312 extend within the BLI 206a, 206b (e.g., from the level shifter 304a to the IMUXs 320). In some examples, the various corresponding input line segments may be the same input line segments. For example, if level shifter 304a is omitted, the input line segments 332, 312 may be the same line segments.

The data and/or clock signals on the respective input line segments 312 are input into various ones of the IMUXs 320 and OMUXs 322 in that BLI 206a, 206b and/or are transmitted to a neighboring BLI 206 via input cross line segments 324. The signals input to the IMUXs 320 correspond to the input line segments 312 of that BLI 206 or a neighboring BLI 206 connected to the respective input nodes of the IMUXs 320 as described previously. Signals output from the IMUXs 320 onto the input line segments 314 are input to the synchronization stage 302. The IMUXs 320 each have a selection control node (not shown) on which a respective control signal is applied to selectively output a signal based on the control signal. The control signal can be a value stored in a register of the register block of the BLI 206a, 206b.

Signals are output on input line segments 344 from the synchronization stage 302 that correspond to the signals on the input line segments 314 that are input to the synchronization stage 302, which will become more apparent subsequently. The input line segments 344 extend within the BLI 206a, 206b (e.g., from the synchronization stage 302 to the level shifter 304b). Input line segments 354 extend from the BLI 206a, 206b (e.g., from the level shifter 304b) to the respective exterior circuit 306. In some examples, the various corresponding input line segments may be the same input line segments. For example, if level shifter 304b is omitted, the input line segments 344, 354 may be the same line segments, and/or if the synchronization stage 302 is omitted or bypassed, input line segments 314, 344 may be the same line segments. As indicated, the signals input to the BLI 206 from the programmable interconnect element 138 may be level shifted by the level shifter 304a, and/or the signals output from the synchronization stage 302 to the exterior circuit 306 may be level shifted by the level shifter 304b.

Signals on the respective output line segments 356 are output from the respective exterior circuit 306. Output line segments 356 extend from the respective exterior circuit 306 to the BLI 206a, 206b (e.g., to the level shifter 304b). Output line segments 346 extend within the BLI 206a, 206b (e.g., from the level shifter 304b to the synchronization stage 302). The output line segments 316 extend within the BLI 206a, 206b (e.g., from the synchronization stage 302 to the OMUXs 322). Signals are output on output line segments 316 from the synchronization stage 302 that correspond to the signals on the output line segments 346 that are input to the synchronization stage 302, which will become more apparent subsequently. In some examples, the various corresponding output line segments may be the same output line segments. For example, if level shifter 304b is omitted, the output line segments 356, 346 may be the same line segments, and/or if the synchronization stage 302 is omitted or bypassed, output line segments 346, 316 may be the same line segments.

The signals on the respective output line segments 316 are input into various ones of the OMUXs 322 in that BLI 206a, 206b and/or are transmitted to a neighboring BLI 206 via output cross line segments 326. The signals input to the OMUXs 322 correspond to the output line segments 316 and input line segment 312 of that BLI 206 and/or output line segment 316 of a neighboring BLI 206 that are connected to the respective input nodes of the IMUXs 320 as described previously. Signals output from the OMUXs 322 onto the output line segments 318 can be input to the level shifter 304a. The OMUXs 322 each have a selection control node (not shown) on which a control signal is applied to selectively output a signal based on the control signal. The control signal can be a value stored in a register of the register block of the BLI 206a, 206b.

Output line segments 338 extend from the BLI 206a, 206b (e.g., from the level shifter 304a) to the respective programmable interconnect element 138. In some examples, the various corresponding output line segments may be the same output line segments. For example, if level shifter 304a is omitted, the output line segments 318, 338 may be the same line segments. As indicated, the signals output from the BLI 206 to the programmable interconnect element 138 may be level shifted by the level shifter 304a, and/or the signals input to the synchronization stage 302 from the exterior circuit 306 may be level shifted by the level shifter 304b.

The BLI 206a, 206b may be configured to operate in a loop-back mode. Signals input to the BLI 206a, 206b from the respective programmable interconnect element 138 on any one of input line segments 332, 312 can be selectively output by the OMUXs 322 to the output line segments 318, 338 to output the signals from the BLI 206a, 206b to the respective programmable interconnect element 138. Any one or more of the signals may be looped back to the respective programmable interconnect element 138. For example, a signal can be communicated on input line segment 312b to OMUX 322a, which can communicate the signal to output line segment 318a.

The multiplexer pattern of FIGS. 7A and 7B is an example of flexibility that may be obtained by a BLI outside of the programmable logic regions 110. The illustrated example is capable of fanning out signals to exterior circuits 306 based on the connections between the BLIs 206. Different patterns of multiplexers may be implemented in a BLI. Since resources in the programmable logic regions 110 may not necessarily be affected by different sizes of BLIs (e.g., resources are not lost from the programmable logic region 110 if a size of a BLI is increased), then any area size of the BLI may be implemented to accommodate any pattern of multiplexers (e.g., including any nesting or funneling of multiplexers).

Figure 8:
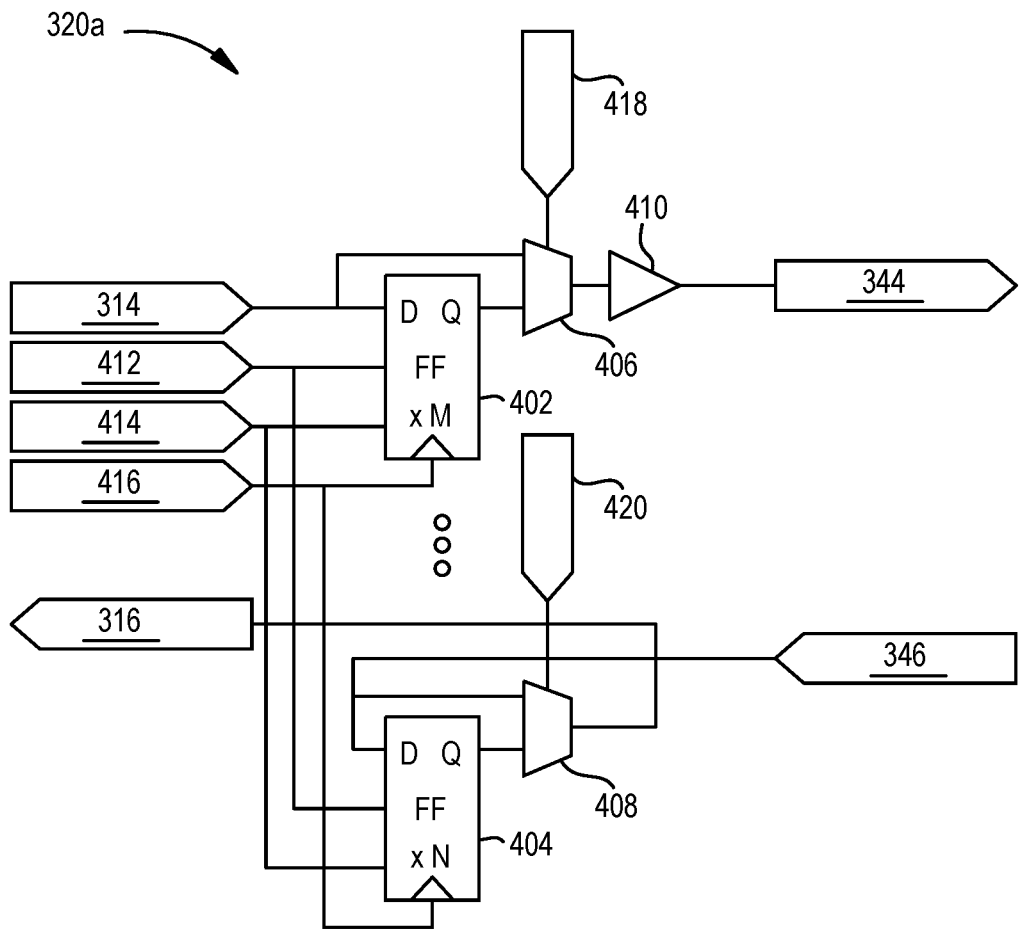
FIG. 8 is a first example of a synchronization stage according to some examples.

FIG. 8 illustrates an example of the synchronization stage 302a according to some examples. The synchronization stage 302a includes flip-flops 402, 404 (e.g., D flip-flops), configuration multiplexers (CMUXs) 406, 408, and a driver 410. FIG. 8 illustrates a configuration for one input route and one output route, which can be repeated for each input route and output route (e.g., for each bit), respectively, of the synchronization stage 302a. The synchronization stage 302a of FIG. 8 is a single flip-flop data path synchronization scheme.

In an input route, an input line segment 314 is connected to a data input node (D) of the flip-flop 402 and to a first input node to the CMUX 406. An output node (Q) of the flip-flop 402 is connected to a second input node of the CMUX 406. An output node of the CMUX 406 is connected to an input node of the driver 410, and an output node of the driver 410 is connected to an input line segment 344. A clock enable line segment 412, a reset line segment 414, and a clock line segment 416 are connected to a clock enable input node, a reset input node, and a clock input node, respectively, of the flip-flop 402. The clock enable line segment 412, reset line segment 414, and clock line segment 416 can be any line segment (e.g., line segment 310 and/or line segment 340) input into the synchronization stage 302a and/or connected to a register of the BLI 206. A select line segment 418 is connected to a select control input node of the CMUX 406.

The input route can operate in a synchronous mode or bypass (or asynchronous mode) based on the control signal on the select line segment 418. In the synchronous mode, the CMUX 406 can output the signal that is input to the CMUX 406 from the output node of the flip-flop 402. The flip-flop 402 can output the signal as a synchronous signal based on a clock signal on the clock line segment 416 input into the clock input node of the flip-flop 402. In the bypass mode, the signal on the input line segment 314 is output by the CMUX 406 irrespective of the clock signal on the clock line segment 416 by bypassing the flip-flop 402.

In an output route, an output line segment 346 is connected to a data input node (D) of the flip-flop 404 and to a first input node to the CMUX 408. An output node (Q) of the flip-flop 404 is connected to a second input node of the CMUX 408. An output node of the CMUX 408 is connected to an output line segment 316. The clock enable line segment 412, reset line segment 414, and clock line segment 416 are connected to a clock enable input node, a reset input node, and a clock input node, respectively, of the flip-flop 404. A select line segment 420 is connected to a select control input node of the CMUX 408.

The output route can operate in a synchronous mode or bypass (or asynchronous mode) based on the signal on the select line segment 420. In the synchronous mode, the CMUX 408 can output the signal that is input to the CMUX 408 from the output node of the flip-flop 404. The flip-flop 404 can output the signal as a synchronous signal based on a clock signal on the clock line segment 416 input into the clock input node of the flip-flop 404. In the bypass mode, the signal on the output line segment 346 is output by the CMUX 408 irrespective of the clock signal on the clock line segment 416 by bypassing the flip-flop 404.

Figure 9:
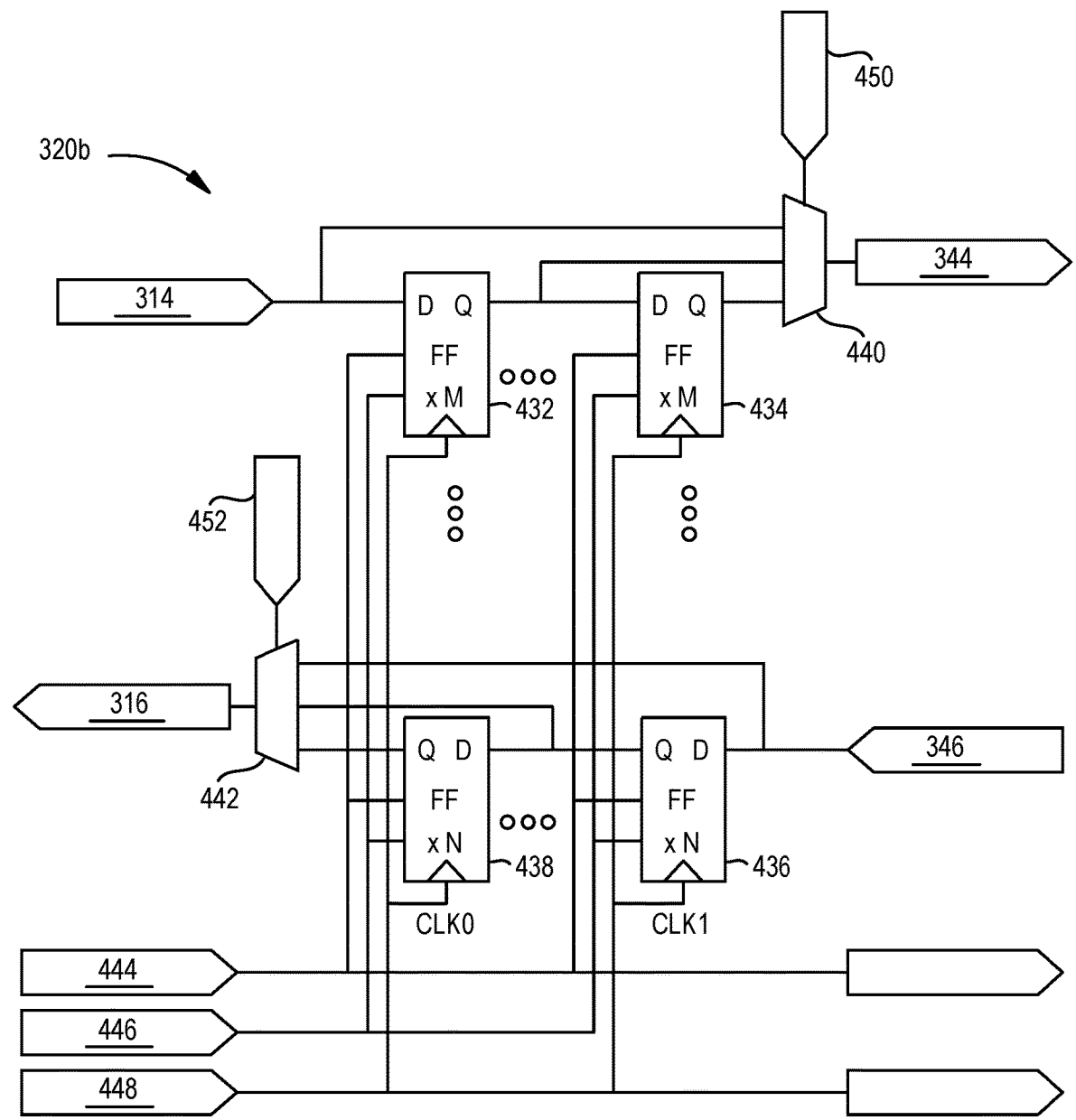
FIG. 9 is a second example of a synchronization stage according to some examples.

FIG. 9 illustrates another example of the synchronization stage 302b according to some examples. The synchronization stage 302b includes flip-flops 432, 434, 436, 438 (e.g., D flip-flops) and CMUXs 440, 442. FIG. 9 illustrates a configuration for one input route and one output route, which can be repeated for each input route and output route (e.g., for each bit), respectively, of the synchronization stage 302b. The synchronization stage 302b of FIG. 9 is a multiple flip-flop data path (e.g., multiple delay) synchronization scheme, such as a two flip-flop data path synchronization scheme as illustrated. The scheme of FIG. 9 can implement a FIFO buffer that can be selectively bypassed, for example.

In an input route, an input line segment 314 is connected to a data input node (D) of the flip-flop 432 and to a first input node to the CMUX 440. An output node (Q) of the flip-flop 432 is connected to a data input node (D) of the flip-flop 434 and to a second input node of the CMUX 440. An output node (Q) of the flip-flop 434 is connected to a third input node of the CMUX 440. An output node of the CMUX 440 is connected to an input line segment 344. A clock enable line segment 444 and a reset line segment 446 are connected to clock enable input nodes and reset input nodes, respectively, of the flip-flops 432, 434. The clock enable line segment 444 and reset line segment 446 can be any line segment input into the synchronization stage 302b and/or connected to a register of the BLI 206. A clock line segment 448 is connected to clock input nodes of the flip-flops 432, 434. The clock line segment 448 is illustrated for simplicity. In some implementations, the clock line segment 448 includes multiple clock line segments 448, such as for multiple clock signals, where a separate clock signal is connected to a respective pipeline stage (e.g., a stage including the flip-flops 432, 436 that are connected to clock signal CLK0, and a stage including the flip-flops 434, 438 that are connected to clock signal CLK1) of the synchronization stage 302b. A select line segment 450 is connected to a select control input node of the CMUX 440. The input route can operate in a one stage pipeline synchronous mode, a two stage pipeline synchronous mode, or bypass (or asynchronous) mode based on the signal on the select line segment 450.

In the two stage pipeline synchronous mode, the CMUX 440 can output the signal that is input to the CMUX 440 from the output node of the flip-flop 434. The flip-flop 434 can output the signal after a signal input on the input line segment 314 passes through the flip-flops 432, 434 based on the clock signals on the clock line segment 448 input into the clock input nodes of the flip-flops 432, 434. By passing a signal through the two flip-flops 432, 434, a two stage pipeline can be achieved.

In the one stage pipeline synchronous mode, the CMUX 440 can output the signal that is input to the CMUX 440 from the output node of the flip-flop 432. The flip-flop 432 can output the signal based on the clock signal on the clock line segment 448 input into the clock input node of the flip-flop 432.

In the bypass mode, the signal on the input line segment 314 is output by the CMUX 440 irrespective of the clock signals on the clock line segment 448 by bypassing the flip-flops 432, 434.

In an output route, an output line segment 346 is connected to a data input node (D) of the flip-flop 436 and to a first input node to the CMUX 442. An output node (Q) of the flip-flop 436 is connected to a data input node (D) of the flip-flop 438 and to a second input node of the CMUX 442. An output node (Q) of the flip-flop 438 is connected to a third input node of the CMUX 442. An output node of the CMUX 442 is connected to an output line segment 316. The clock enable line segment 444 and the reset line segment 446 are connected to clock enable input nodes and reset input nodes, respectively, of the flip-flops 436, 438. The clock line segment 448 is connected to clock input nodes of the flip-flops 436, 438, as described above with respect to the flip-flops 432, 434. A select line segment 452 is connected to a select control input node of the CMUX 442. The output line can operate in a one stage pipeline synchronous mode, a two stage pipeline synchronous mode, or bypass (or asynchronous) mode based on the signal on the select line segment 452.

In the two stage pipeline synchronous mode, the CMUX 442 can output the signal that is input to the CMUX 442 from the output node of the flip-flop 438. The flip-flop 438 can output the signal after a signal input on the output line segment 346 passes through the flip-flops 436, 438 based on the clock signals on the clock line segment 448 input into the clock input nodes of the flip-flops 436, 438. By passing a signal through the two flip-flops 436, 438, a two stage pipeline can be achieved.

In the one stage pipeline synchronous mode, the CMUX 442 can output the signal that is input to the CMUX 442 from the output node of the flip-flop 436. The flip-flop 436 can output the signal based on the clock signal on the clock line segment 448 input into the clock input node of the flip-flop 436.

In the bypass mode, the signal on the output line segment 346 is output by the CMUX 442 irrespective of the clock signals on the clock line segment 448 by bypassing the flip-flops 436, 438.

As previously stated, FIG. 9 illustrates a two stage pipeline. In other examples, additional pipeline stages can be implemented by including additional stages of flip-flops in the input and output routes. The output nodes of the flip-flop in each stage can be connected to respective input nodes of a CMUX to permit selectively outputting a signal after any number of pipeline stages have been passed by the signal. The signals on the select line segments 450, 452, respectively, can be controlled by a state machine synchronous or asynchronous to the clock signal on the clock line segment 448. Controlling the state of CMUX 440 or 442 can create an elastic buffer of FIFO functionality for data transfer between the programmable logic region 110 and boundary clock domains.

Figure 10:
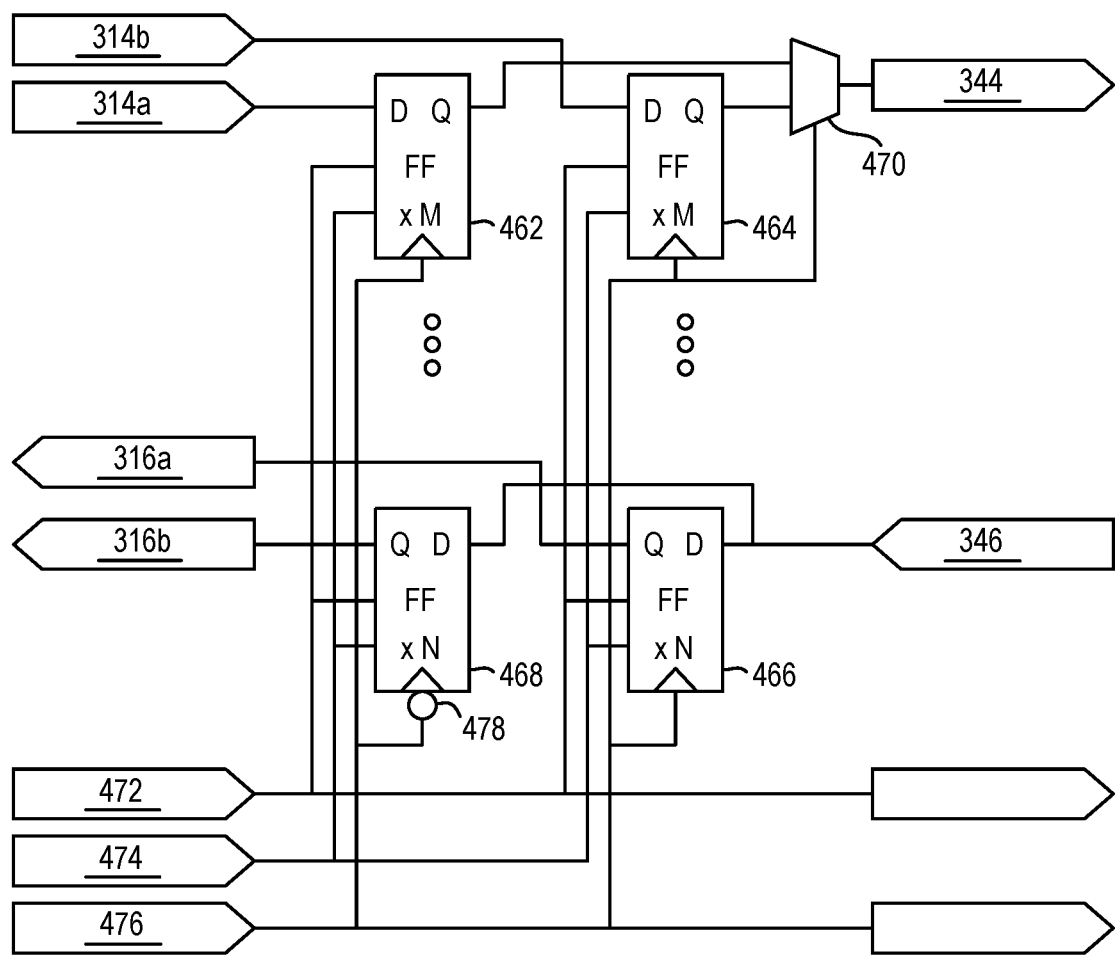
FIG. 10 is a third example of a synchronization stage according to some examples.

FIG. 10 illustrates another example of the synchronization stage 302c according to some examples. The synchronization stage 302c includes flip-flops 462, 464, 466, 468 (e.g., D flip-flops) and a CMUX 470. FIG. 10 illustrates a configuration for one DDR input route conversion and one DDR output route conversion, which can be repeated for multiple input route and output route conversions, respectively, of the synchronization stage 302c. The synchronization stage 302c of FIG. 10 is a DDR data path synchronization scheme.

In an input route, respective input line segments 314 (illustrated as input line segments 314a and 314b for simplicity) are connected to data input nodes (D) of the flip-flops 462, 464. Output nodes (Q) of the flip-flops 462, 464 are connected to respective input nodes of the CMUX 470. An output node of the CMUX 470 is connected to an input line segment 344. A clock enable line segment 472 and a reset line segment 474 are connected to clock enable input nodes and a reset input nodes, respectively, of the flip-flops 462, 464. The clock enable line segment 472 and a reset line segment 474 can be any line segment input into the synchronization stage 302c and/or connected to a register of the BLI 206. A clock line segment 476 is connected to clock input nodes of the flip-flops 462, 464. The clock line segment 476 is further connected to a select control input node of the CMUX 470. As the clock signal on the clock line segment 476 toggles between a high logic state and a low logic state, the CMUX 470 toggles between outputting the data signal output by the flip-flop 462 and the data signal output by the flip-flop 464. Hence, the data signal output by the CMUX 470 can be a DDR signal.

In an output route, an output line segment 346 is connected to data input nodes (D) of the flip-flops 466, 468. An output node (Q) of the flip-flop 466 is connected to an output line segment 316 (illustrated for simplicity as output line segment 316a). An output node (Q) of the flip-flop 468 is connected to an output line segment 316 (illustrated for simplicity as output line segment 316a). The clock enable line segment 472 and the reset line segment 474 are connected to clock enable input nodes and reset input nodes, respectively, of the flip-flops 466, 468. The clock line segment 476 is connected to an input node of an inverter 478 and to a clock input node of the flip-flop 466. An output node of the inverter 478 is connected to a clock input node of the flip-flop 468.

The flip-flop 466 outputs to the output line segment 316a the data signal on the output line segment 346 when the clock signal on the clock line segment 476 rises, and the flip-flop 468 outputs to the output line segment 316b the data signal on the output line segment 346 when the clock signal on the clock line segment 476 falls (due to the presence of the inverter 478 that inverts the clock signal). Hence, the DDR signal on the output line segment 346 can be converted to two single data rate signals on the output line segments 316a, 316b.

Figure 11:
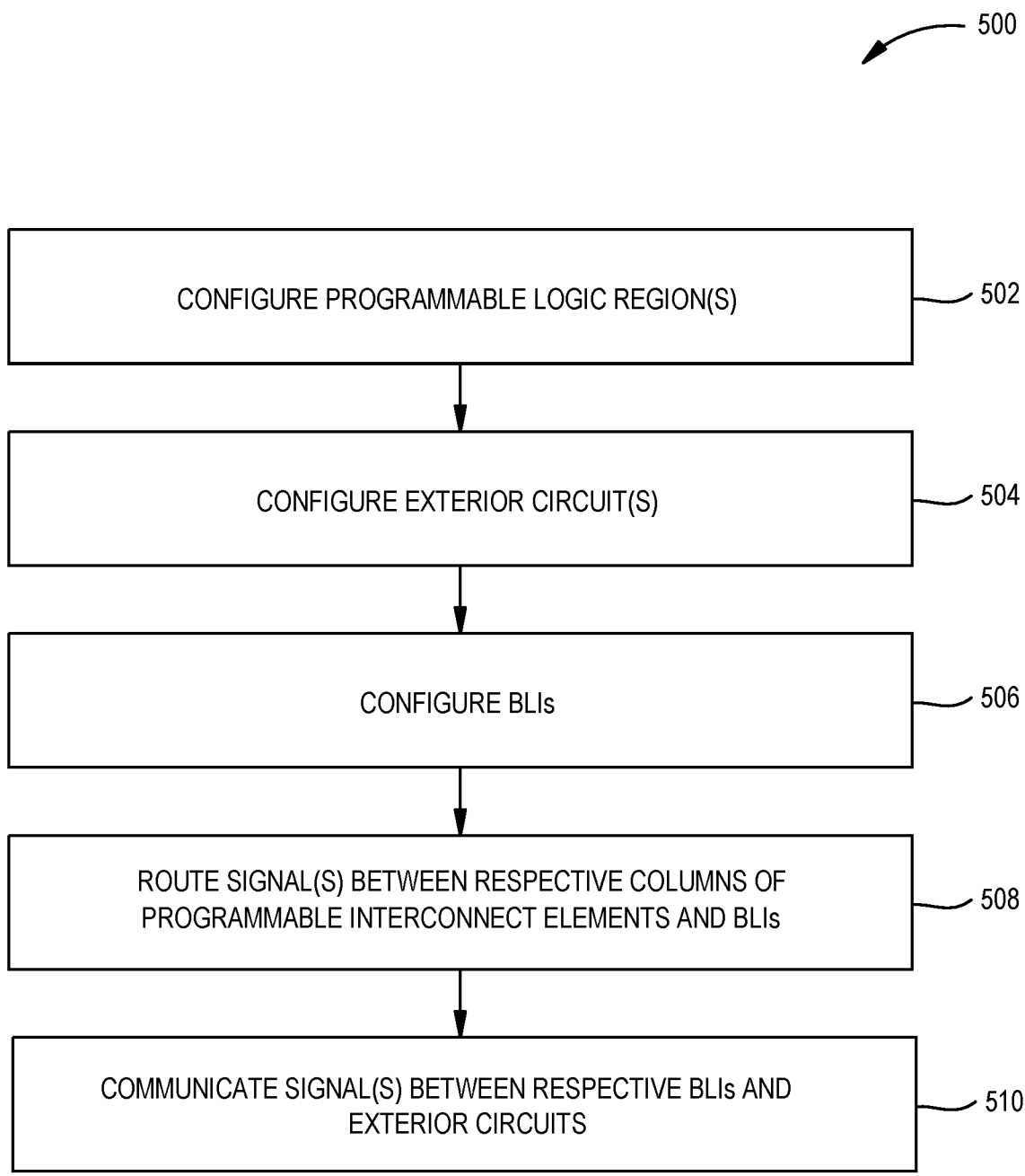
FIG. 11 is a flow chart of a method for operating an IC according to some examples.

FIG. 11 is a flow chart of a method 500 for operating an IC according to some examples. The IC can be or include the SoC 102 of FIG. 1, the FPGA of FIG. 2, or another IC with a programmable logic region. The IC includes a programmable logic region and BLIs. The BLIs are outside of a boundary of the programmable logic region of the IC, such as described previously. The programmable logic region can include columns of programmable interconnect elements, and each BLI can be connected to a respective column of programmable interconnect elements, such as described previously.

At block 502, programmable logic region(s) are configured. The programmable logic region(s) can be configured by transmitting configuration data from a processing system (e.g., a PMC) via a configuration interconnect (e.g., a frame-based interconnect). Configuring the programmable logic region(s) can instantiate any logic function, program, kernel, etc. in the programmable logic region(s).

At block 504, optionally, exterior circuit(s) are configured. For example, when exterior circuits are configurable, the exterior circuits can be configured by memory mapped write requests via an NPI of a NoC. Configuring the exterior circuits can permit the exterior circuits to accommodate a logic function, program, kernel, etc. instantiated in the programmable logic region(s).

At block 506, BLIs are configured. The BLIs can be configurable, such as including multiplexers used to communicate various signals and/or used to synchronize signals for pipelining and/or single-to-double (or double-to-single) data rate conversion. In some examples, the BLIs can be configured using a same scheme, e.g., a configuration frame scheme, that is implemented to configure the programmable logic region(s). In some examples, the BLIs can be configured using a different configuration scheme from what is used to configure the programmable logic region(s), such as using a peripheral interconnect, such as a NPI in a NoC as described previously.

At block 508, one or more signals are routed between respective columns of programmable interconnect elements and BLIs. For example, referring to FIGS. 7A and 7B, signals are routed from the columns of programmable interconnect elements 138 to BLIs 206 via line segments 330, 332, and signals are communicated from the BLIs 206 via line segments 330, 338 to and routed in the columns of programmable interconnect elements 138.

At block 510, one or more signals are communicated between respective BLIs and exterior circuits. For example, referring to FIGS. 7A and 7B, signals are communicated from the BLIs 206 to exterior circuits 306 via line segments 350, 354, and signals are communicated from the exterior circuits 306 to the BLIs 206 via line segments 350, 356. Communicating the signals between the BLIs and exterior circuits can include level shifting the signals within respective BLIs (e.g., by level shifter 304a or 304b).

According to some examples, one or more signals can be communicated through the BLI 206 (e.g., from the programmable interconnect element 138 to the exterior circuit 306) directly without communicating the one or more signals through a logic circuit. The one or more signals may be communicated through a level shifter to permit crossing power domains.

According to some examples, one or more signals can be selectively communicated from the BLI. For example, referring to FIGS. 7A and 7B, a signal can be selectively communicated from the BLI 206 via an input line segment 314, 344, 354 to an exterior circuit 306 by selectively outputting the signal from an IMUX 320, which has input nodes on which signals received from the programmable interconnect element 138 are provided via input line segments 332, 312. Similarly, a signal can be selectively communicated from the BLI 206 via an output line segment 318, 338 to a programmable interconnect element 138 by selectively outputting the signal from an OMUX 322, which has input nodes on which signals received from the exterior circuit 306 are provided via output line segments 356, 346, 316.

According to some examples, one or more signals can be communicated between BLIs, such as without communicating the one or more signals through any programmable interconnect element in the programmable logic region. For example, referring to FIGS. 7A and 7B, a signal can be communicated from the BLI 206a to the BLI 206 via cross line segments 324, 326. As an example, a signal received from the programmable interconnect element 138 via input line segment 332, 312c in the BLI 206a is communicated via input cross line segment 324a to the BLI 206b, where the signal is input to the IMUX 320a of the BLI 206b and can be selectively output to the exterior circuit 306 via input line segments 314a, 344, 354. Also as an example, a signal received from the exterior circuit 306 via output line segment 356, 346, 316c in the BLI 206a is communicated via output cross line segment 326c to the BLI 206b, where the signal is input to the OMUX 322c of the BLI 206b and can be selectively output to the programmable interconnect element 138 via output line segments 318c, 338. This communicating of signals between BLIs can enable oversubscription.

According to some examples, one or more signals received from a programmable interconnect element may be looped back to the programmable interconnect element. For example, referring to FIGS. 7A and 7B, a signal can be received from the programmable interconnect element 138 via input line segment 312b. The signal is input to the OMUX 322a, which is selectively output on output line segment 318a to loop the signal back to the programmable interconnect element 138.

An example of the present disclosure is an IC. The IC includes a programmable logic region, boundary logic interfaces, and an exterior circuit. The programmable logic region includes columns of interconnect elements disposed between columns of logic elements. The boundary logic interfaces are at respective ends of and communicatively connected to the columns of interconnect elements. The boundary logic interfaces are outside of a boundary of the programmable logic region. The exterior circuit is communicatively connected to a first boundary logic interface (BLI) of the boundary logic interfaces. The first BLI includes an interface configured to communicate a signal between the exterior circuit and the programmable logic region. The boundary logic interfaces may have any aspect or feature described previously.

Another example of the present disclosure is an IC. The IC includes a programmable logic region, boundary logic interfaces, and an exterior circuit. The programmable logic region includes columns of interconnect elements disposed between columns of logic elements. The columns of interconnect elements are configurable to form a global routing network in the programmable logic region. Respective horizontal interconnect segments extend horizontally between horizontally neighboring interconnect elements, and respective vertical interconnect segments extend vertically between vertically neighboring interconnect elements. The boundary logic interfaces are at respective ends of and communicatively connected to the columns of interconnect elements. The exterior circuit is communicatively connected to a first boundary logic interface (BLI) of the boundary logic interfaces. The first BLI includes an interface configured to communicate a signal between the exterior circuit and the programmable logic region. The first BLI includes line segments that extend in the first BLI and are electrically connected to respective vertical interconnect segments of the respective column of interconnect elements to which the first BLI is communicatively connected. The line segments are configured to communicate signals from the respective column of interconnect elements through the first BLI without communicating the signals through a logic circuit. The line segments may be directly connected to the interconnect elements to provide a direct connection to the global routing network. The line segments may have direct access to data and/or clock signals from the global routing network. The boundary logic interfaces may or may not be outside of a boundary of the programmable logic region. The boundary logic interfaces may each additionally include logic for selectively communicating signals. The boundary logic interfaces may have direct connections between neighboring ones of the boundary logic interfaces. The boundary logic interfaces may have any aspect or feature described previously.

Another example of the present disclosure is an IC. The IC includes a programmable logic region, boundary logic interfaces, and an exterior circuit. The programmable logic region includes columns of interconnect elements disposed between columns of logic elements. The boundary logic interfaces are at respective ends of and communicatively connected to the columns of interconnect elements. Any one or more of the boundary logic interfaces may each include a synchronization stage. The synchronization stage can include a single pipeline stage or multiple pipeline stages, which can further be configured with a bypass. The synchronization stage can include a conversion circuit configured to convert signals from a single data rate to a double data rate, and vice versa. The boundary logic interfaces may or may not be outside of a boundary of the programmable logic region. The boundary logic interfaces may have any aspect or feature described previously.

While the foregoing is directed to specific examples, other and further examples may be devised without departing from the basic scope thereof, and the scope thereof is determined by the claims that follow.

What is claimed is:

1. An integrated circuit (IC) comprising:
   a programmable logic region comprising columns of interconnect elements disposed between columns of logic elements;
   a configuration interconnect communicatively coupled to the programmable logic region, the interconnect elements and the logic elements of the programmable logic region being configurable using a configuration frame communicated through the configuration interconnect, a boundary of the programmable logic region being defined by an integer multiple of the configuration frame; and
   boundary logic interfaces at respective ends of and communicatively connected to the columns of interconnect elements, the boundary logic interfaces being outside of the boundary of the programmable logic region, a first boundary logic interface (BLI) of the boundary logic interfaces being configured to be communicatively connected to an exterior circuit, the first BLI including an interface configured to communicate a signal between the exterior circuit and the programmable logic region.

2. The IC of claim 1 further comprising:
   a peripheral interconnect, at least some of the boundary logic interfaces including configurable logic, the configurable logic being configurable through the peripheral interconnect.

3. The IC of claim 1, wherein the first BLI has a first width perpendicular to a first column of the columns of interconnect elements to which the first BLI is communicatively connected, the first column having a second width, the first width being greater than the second width.

4. The IC of claim 1 further comprising the exterior circuit communicatively connected to the first BLI, wherein a first number of line segments are connected between the first BLI and a first column of the columns of interconnect elements, and a second number of line segments extend from the first BLI towards the exterior circuit in a direction parallel to the first column, the second number being greater than the first number.

5. The IC of claim 1, wherein the first BLI is electrically connected to a first column of the columns of interconnect elements, the first BLI including:
   a first multiplexer having first input nodes electrically connected to input line segments configured to communicate respective signals corresponding to signals received from the first column, and having a first output node connected to an input line segment configured to communicate a selected signal towards the exterior circuit; and
   a second multiplexer having second input nodes electrically connected to output line segments configured to communicate respective signals corresponding to signals received from the exterior circuit, and having a second output node connected to an output line segment configured to communicate a selected signal towards the first column.

6. The IC of claim 5, wherein at least one of the input line segments is electrically connected to at least one of the second input nodes of the second multiplexer.

7. The IC of claim 5, wherein:
the first BLI is electrically connected to a second BLI of the boundary logic interfaces, the second BLI neighboring the first BLI;
the second BLI includes:
　a third multiplexer having a third output node connected to an input line segment configured to communicate a selected signal towards a circuit; and
　a fourth multiplexer having a fourth output node connected to an output line segment configured to communicate a signal towards the programmable logic region;
at least one of the input line segments of the first BLI is electrically connected to at least one of input nodes of the third multiplexer; and
at least one of the output line segments of the first BLI is electrically connected to at least one of input nodes of the fourth multiplexer.

8. The IC of claim 1, wherein the first BLI includes a synchronization stage, the synchronization stage including at least one flip-flop in each input route and each output route of the first BLI.

9. The IC of claim 1, wherein the first BLI includes a synchronization stage, the synchronization stage including a multiple stage pipeline in each input route and each output route of the first BLI.

10. The IC of claim 1, wherein the first BLI includes a synchronization stage, the synchronization stage including:
　a first flip-flop and a second flip-flop having respective data input nodes electrically connected to a first line segment configured to receive a double data rate signal from the exterior circuit, the first flip-flop and the second flip-flop having respective data output nodes electrically connected to a second line segment and a third line segment, respectively, in the first BLI, the first flip-flop and the second flip-flop being configured to convert the double data rate signal on the first line segment to respective single data rate signals on the second line segment and the third line segment; and
　a third flip-flop, a fourth flip-flop, and a multiplexer, the third flip-flop having a data input node electrically connected to a fourth line segment in the first BLI, the fourth flip-flop having a data input node electrically connected to a fifth line segment in the first BLI, the third flip-flop and the fourth flip-flop having respective data output nodes electrically connected to respective input nodes of the multiplexer, the multiplexer having an output node electrically connected to a sixth line segment, the third flip-flop, the fourth flip-flop, and the multiplexer being configured to convert respective single data rate signals on the fourth line segment and the fifth line segment to a double data rate signal on the sixth line segment.

11. The IC of claim 1, wherein the first BLI includes line segments extending from a first column of the columns of interconnect elements away from the programmable logic region, wherein the line segments are configured to communicate respective signals between the first column and the exterior circuit without communicating the respective signals through a logic circuit of the first BLI.

12. A method for operating an integrated circuit (IC), the method comprising:
　routing one or more first signals between a first column of interconnect elements in a programmable logic region and a first boundary logic interface (BLI) outside of a boundary of the programmable logic region, a configuration interconnect being communicatively coupled to the programmable logic region, the interconnect elements in the programmable logic region being configurable using a configuration frame communicated through the configuration interconnect, the boundary of the programmable logic region being defined by an integer multiple of the configuration frame; and
　communicating one or more second signals between the first BLI and an exterior circuit.

13. The method of claim 12 further comprising communicating a signal received from the first column to the exterior circuit through the first BLI without communicating the signal through a logic circuit in the first BLI.

14. The method of claim 12, wherein communicating the one or more second signals between the first BLI and the exterior circuit further comprises:
　communicating the one or more second signals between the first BLI and a second BLI, the second BLI further being configured to communicate one or more third signals between a second column of interconnect elements in the programmable logic region, the second BLI being outside of the boundary of the programmable logic region; and
　communicating the one or more second signals between the second BLI and the exterior circuit.

15. An integrated circuit (IC) comprising:
　a programmable logic region defined by a boundary, the programmable logic region comprising:
　　a first column of programmable interconnect elements;
　　a second column of programmable logic elements electrically connected to the first column;
　　a third column of programmable interconnect elements; and
　　a fourth column of programmable logic elements electrically connected to the third column;
　a configuration interconnect communicatively coupled to the programmable logic region, the first column and third column of programmable interconnect elements and the second column and the fourth column of programmable logic elements of the programmable logic region being configurable using a configuration frame communicated through the configuration interconnect, the boundary of the programmable logic region being defined by an integer multiple of the configuration frame;
　a first boundary logic interface (BLI) electrically connected to the first column and outside of the boundary, the first BLI being configured to be electrically connected to a first exterior circuit; and
　a second BLI electrically connected to the third column and outside of the boundary, the second BLI being configured to be electrically connected to a second exterior circuit.

16. The IC of claim 15, wherein the first BLI is configured to communicate a signal from the first column to the first exterior circuit without communicating the signal through a logic circuit.

17. The IC of claim 15, wherein the first BLI is directly connected to the second BLI, the first BLI and the second BLI being configured to communicate a signal between the first BLI and the second BLI.

18. The IC of claim 15, wherein each of the first BLI and the second BLI includes a synchronization stage having a pipeline.

19. The IC of claim 15, wherein each of the first BLI and the second BLI includes a synchronization stage having:
　a first conversion circuit configured to convert two first single data rate signals corresponding to signals received from the programmable logic region to a first double data rate signal; and a second conversion circuit configured to convert a second double data rate signal received from the respective exterior circuit to two second single data rate signals.

* * * * *